(12) United States Patent
Xu

(10) Patent No.: US 11,374,035 B2
(45) Date of Patent: Jun. 28, 2022

(54) ARRAY SUBSTRATE AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Zuzhao Xu, Wuhan (CN)

( * ) Notice: Subject to any disclaimer, the term of this patent is extended or adjusted under 35 U.S.C. 154(b) by 297 days.

(21) Appl. No.: 16/652,040

(22) PCT Filed: Dec. 3, 2019

(86) PCT No.: PCT/CN2019/122668
§ 371 (c)(1),
(2) Date: Mar. 28, 2020

(87) PCT Pub. No.: WO2021/012567
PCT Pub. Date: Jan. 28, 2021

(65) Prior Publication Data
US 2021/0028195 A1 Jan. 28, 2021

(30) Foreign Application Priority Data

Jul. 25, 2019 (CN) .......................... 201910677565.6

(51) Int. Cl.
*H01L 27/14* (2006.01)
*H01L 27/12* (2006.01)
(52) U.S. Cl.
CPC ...... *H01L 27/1244* (2013.01); *H01L 27/1218* (2013.01); *H01L 27/1255* (2013.01)

(58) Field of Classification Search
CPC ............. H01L 27/1244; H01L 27/1218; H01L 27/1255
USPC ................................................ 257/59, 71, 72
See application file for complete search history.

(56) References Cited

U.S. PATENT DOCUMENTS

2004/0257487 A1* 12/2004 Lee .................. G02F 1/136286
349/43
2018/0366586 A1 12/2018 Son

FOREIGN PATENT DOCUMENTS

| CN | 105742296 A | 7/2016 |
|---|---|---|
| CN | 109585511 A | 4/2019 |
| CN | 109671721 A | 4/2019 |
| CN | 109671722 A | 4/2019 |
| CN | 110190073 A | 8/2019 |

* cited by examiner

*Primary Examiner* — Tan N Tran

(57) ABSTRACT

The present application provides an array substrate and a display panel. The array substrate includes a substrate, an active layer, a first metal layer, a second metal layer, a flexible material layer, and a source/drain layer which are disposed in a stack. The active layer forms a source and a drain and connected to a first connection member formed by the second metal layer through a first through-hole. The first connection member is connected to a doped region of the active layer by a second through-hole. An aperture of the first through-hole is greater than an aperture of the second through-hole. Therefore, a technical problem of a poor connection between the source/drain and the active layer is relieved.

19 Claims, 8 Drawing Sheets a b

600 c a     b a b

ARRAY SUBSTRATE AND DISPLAY PANEL

CROSS-REFERENCE TO RELATED APPLICATIONS

This application claims priority to Chinese patent application No. 201910677565.6, titled "ARRAY SUBSTRATE" and filed on Jul. 25, 2019 with the China National Intellectual Property Administration, which is incorporated by reference in the present application in its entirely.

FIELD OF APPLICATION

The present application is related to the field of display technology, and specifically to an array substrate and a display panel.

BACKGROUND OF APPLICATION

Currently, in processes of manufacturing a flexible display panel, in order to improve a bending performance of the flexible display panel, an organic flexible material layer is usually formed on an interlayer insulating layer, and a source/drain is connected to an active layer by through-holes in the organic flexible material layer, the interlayer insulating layer, and a gate insulating layer. However, a presence of the organic material layer increases a difference between film layers and increases a depth of each of the through-holes, thereby causing the source/drain to be disconnected from the active layer, and data signals cannot be written.

Therefore, flexible display panels in the prior art have a technical problem of poor connection between the source and the drain and the active layer, which needs to be resolved.

SUMMARY OF APPLICATION

In order to solve the above problem, the present application provides technical solutions as follows.

The present application provides am array substrate including:
  a substrate;
  an active layer formed on a side of the substrate and patterned to form a channel region and a doped region;
  a first metal layer formed on a side of the active layer away from the substrate and patterned to form a gate;
  a second metal layer formed on a side of the first metal layer away from the active layer and patterned to form a first connection member;
  a flexible material layer formed on a side of the second metal layer away from the first metal layer; and
  a source/drain layer formed on a side of the flexible material layer away from the second metal layer and patterned to form a source and a drain;
  wherein the source or the drain is connected to the first connection member by a first through-hole, the first connection member is connected to the doped region by a second through-hole, and an aperture of the first through-hole is greater than an aperture of the second through-hole.

In the array substrate of the present application, the first connection member includes a first connection end and a second connection end, the first connection end is connected to the first through-hole, the second connection end is connected to the second through-hole, and a projection of the first connection end on the substrate coincides with a projection of the second connection end on the substrate.

In the array substrate of the present application, the first connection member includes a first connection end and a second connection end, the first connection end is connected to the first through-hole, the second connection end is connected to the second through-hole, and a projection of the first connection end on the substrate does not coincide with a projection of the second connection end on the substrate.

In the array substrate of the present application, the first connection member is parallel to the second electrode plate.

In the array substrate of the present application, a distance between the first connection member and the second electrode plate is greater than or equal to a quarter of a width of a sub-pixel in the array substrate.

In the array substrate of the present application, a length of the first connection member is less than a length of the second electrode plate.

In the array substrate of the present application, the array substrate includes a third through-hole, the flexible material layer is connected to the substrate by the third through-hole, and a distance between the first through-hole and the third through-hole is greater than a preset value.

In the array substrate of the present application, the second through-hole includes a first branch-through-hole and a second branch-through-hole, the first metal layer is further patterned to formed a second connection member, the first connection member is connected to the second connection member by the first branch-through-hole, and the second connection member is connected to the doped region by the second branch-through-hole.

In the array substrate of the present application, the array substrate includes a plurality of pixels, a sub-pixel of the plurality of pixels includes a first transistor, a second transistor, a third transistor, a fourth transistor, a fifth transistor, a sixth transistor, a seventh transistor, and a storage capacitor, the source/drain layer is further patterned to form a data signal line and a power line, the first metal layer is further patterned to form a first scan signal line and a first electrode plate of the storage capacitor, the second metal layer is patterned to form the first connection member and a second electrode plate of the storage capacitor, the first connection member includes a first sub-connection member, a second sub-connection member, a third sub-connection member, and a fourth sub-connection member, the first transistor is a driving transistor, the second transistor is a switching transistor, and the source/drain layer is connected to the doped region of the active layer of at least one of the second transistor, the third transistor, the fifth transistor, or the sixth transistor by the first connection member.

In the array substrate of the present application, a gate of the second transistor is connected to the first scan signal line, a first electrode of the second transistor is connected to the data signal line, the first electrode of the second transistor is connected to the first sub-connection member by a first sub-through-hole, and the first sub-connection member is connected to the doped region of the active layer of the second transistor by a fifth sub-through-hole.

In the array substrate of the present application, a first electrode of the fifth transistor is connected to the power line, the first electrode of the fifth transistor is connected to the second sub-connection member by a second sub-through-hole, and the second sub-connection member is connected to the doped region of the active layer of the fifth transistor by a sixth sub-through-hole.

In the array substrate of the present application, the source/drain layer is further patterned to form a first connection line, one end of the first connection line is connected to the first electrode plate of the storage capacitor, another end of the first connection line is connected to the third sub-connection member by a third sub-through-hole, and the third sub-connection member is connected to the doped region of the active layer of the third transistor by a seventh sub-through-hole.

In the array substrate of the present application, the source/drain layer is further patterned to form a second connection line, one end of the second connection line is connected to an anode of the plurality of pixels, another end of the second connection line is connected to the fourth sub-connection member by a fourth sub-through-hole, and the fourth sub-connection member is connected to the doped region of the active layer of the sixth transistor by an eighth sub-through-hole.

The present application further provides a display panel including an array substrate. The array substrate includes:
 a substrate;
 an active layer formed on a side of the substrate and patterned to form a channel region and a doped region;
 a first metal layer formed on a side of the active layer away from the substrate and patterned to form a gate;
 a second metal layer formed on a side of the first metal layer away from the active layer and patterned to form a first connection member;
 a flexible material layer formed on a side of the second metal layer away from the first metal layer; and
 a source/drain layer formed on a side of the flexible material layer away from the second metal layer and patterned to form a source and a drain;
 wherein the source or the drain is connected to the first connection member by a first through-hole, the first connection member is connected to the doped region by a second through-hole, and an aperture of the first through-hole is greater than an aperture of the second through-hole.

In the display panel of the present application, the first connection member includes a first connection end and a second connection end, the first connection end is connected to the first through-hole, the second connection end is connected to the second through-hole, and a projection of the first connection end on the substrate coincides with a projection of the second connection end on the substrate.

In the display panel of the present application, the first connection member includes a first connection end and a second connection end, the first connection end is connected to the first through-hole, the second connection end is connected to the second through-hole, and a projection of the first connection end on the substrate does not coincide with a projection of the second connection end on the substrate.

In the display panel of the present application, the first connection member is parallel to the second electrode plate.

In the display panel of the present application, a distance between the first connection member and the second electrode plate is greater than or equal to a quarter of a width of a sub-pixel in the array substrate.

In the display panel of the present application, a length of the first connection member is less than a length of the second electrode plate.

In the display panel of the present application, the array substrate includes a third through-hole, the flexible material layer is connected to the substrate by the third through-hole, and a distance between the first through-hole and the third through-hole is greater than a preset value.

The present application provides the array substrate and the display panel. The array substrate includes the substrate, the active layer, the first metal layer, the second metal layer, the flexible material layer, and the source/drain layer. The active layer is formed on the side of the substrate and is patterned to form the channel region and the doped region. The first metal layer is formed on the side of the active layer away from the substrate and is patterned to form the gate. The second metal layer is formed on the side of the first metal layer away from the active layer and is patterned to form the first connection member. The flexible material layer is formed on the side of the second metal layer away from the first metal layer. The source/drain layer is formed on the side of the flexible material layer away from the second metal layer and is patterned to form the source and the drain. The source or the drain is connected to the first connection member by the first through-hole. The first connection member is connected to the doped region by the second through-hole. The aperture of the first through-hole is greater than the aperture of the second through-hole. By disposing the first through-hole and the second through-hole, the source and the drain use the second metal layer as a transition and are connected to the active layer in two stages, and a depth of each through-hole is reduced compared to a one-stage connection of a through-hole. Therefore, it is easier for film layers disposed on both ends of the through-holes to realize connections, and a technical problem of a poor connection between the source and the drain and the active layer is relieved.

DESCRIPTION OF DRAWINGS

In order to describe technical solutions in the present application clearly, drawings to be used in the description of embodiments will be described briefly below. Obviously, drawings described below are only for some embodiments of the present application, and other drawings may be obtained by those skilled in the art based on these drawings without creative efforts.

DETAILED DESCRIPTION OF PREFERRED EMBODIMENTS

Figure 1:
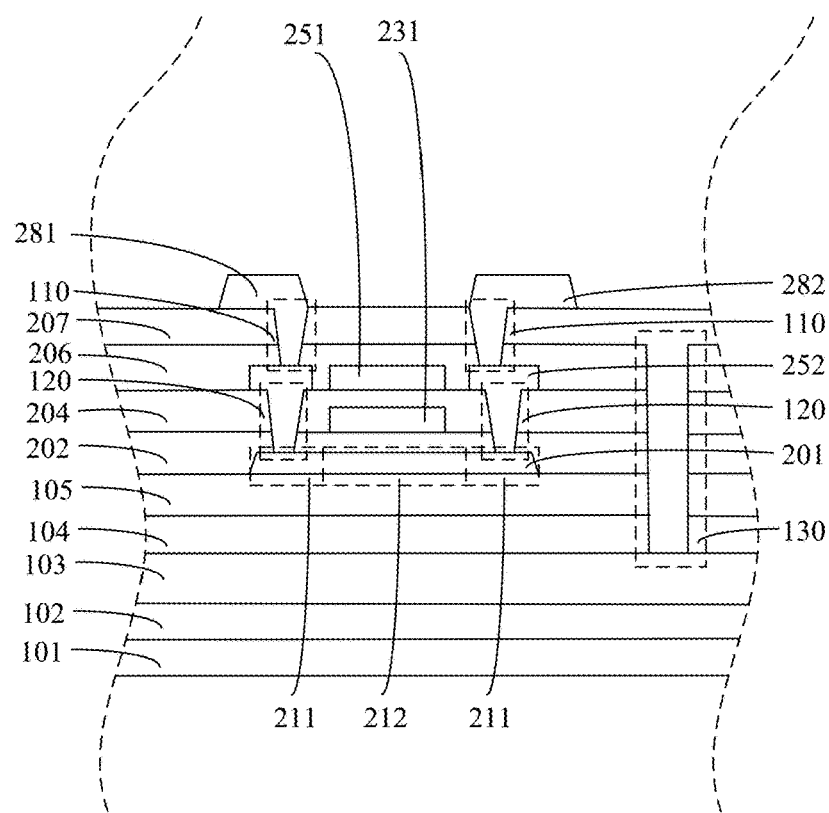
FIG. 1 is a first structural diagram of an array substrate provided by an embodiment of the present application.

Examples are described below with reference to the appended drawings, and the drawings illustrate particular embodiments in which the present invention may be practiced. Directional terms mentioned in the present invention, such as upper, lower, front, rear, left, right, in, out, side, etc., only refer to directions in the accompanying drawings. Thus, the adoption of directional terms is used to describe and understand the present invention, but not to limit the present invention. In the drawings, units of similar structures are represented using the same numerals.

The present application provides an array substrate to relieve a technical problem of a poor connection between a source/drain and an active layer in the prior art.

The array substrate of the present application includes a substrate, an active layer, a first metal layer, a second metal layer, a flexible material layer, and a source/drain layer. The active layer is formed on a side of the substrate and is patterned to form a channel region and a doped region. The first metal layer is formed on a side of the active layer away from the substrate and is patterned to form a gate. The second metal layer is formed on a side of the first metal layer away from the active layer and is patterned to form a first connection member. The flexible material layer is formed on a side of the second metal layer away from the first metal layer. The source/drain layer is formed on a side of the flexible material layer away from the second metal layer and is patterned to form a source and a drain. The source or the drain is connected to the first connection member by a first through-hole. The first connection member is connected to the doped region by a second through-hole. An aperture of the first through-hole is greater than an aperture of the second through-hole.

As shown in FIG. 1, which is a first structural diagram of the array substrate provided by an embodiment of the present application, the substrate is a flexible substrate and generally is a single layer flexible material or a laminated structure flexible material. In this embodiment, the substrate includes a first flexible substrate 101, a blocking layer 102 formed on a side of the first flexible substrate 101, and a second flexible substrate 103 formed on a side of the blocking layer 102. The blocking layer 102 is used to isolate water and oxygen. Materials of the first flexible substrate 101 and the second flexible substrate 103 can be polyimide or other flexible materials.

A buffer layer 104 is further formed on a side of the second flexible substrate 103 away from the blocking layer 102.

The active layer 201 is formed on a side of the buffer layer 104 away from the substrate and patterned to form the doped region 211 and the channel 212 region between two doped regions 211.

A first gate insulating layer 202 is formed on a side of the active layer 201 away from the buffer layer 104 and extends to cover the active layer 201.

The first metal layer is formed on the side of the active layer 201 away from the substrate and is patterned to form the gate 231.

A second gate insulating layer 204 is formed on a side of the first metal layer away from the first gate insulating layer 202.

The second metal layer is formed on a side of the second gate insulating layer 204 away from the active layer 201 and is patterned to form the first connection member 252.

An interlayer insulating layer 206 is formed on a side of the second metal layer away from the second gate insulating layer 204.

The flexible material layer 207 is further formed on a side of the interlayer insulating layer 206 away from the second metal layer. Material of the flexible material layer 207 is generally an organic flexible material. The flexible material layer 207 can increase flexibility of the array substrate. The source/drain layer is formed on a side of the flexible material layer 207 away from the interlayer insulating layer 206 and is patterned to form the source 281 and the drain 282.

The array substrate further includes the first through-hole 110 and the second through-hole 120. The source 281 or the drain 282 is connected to the first connection member 252 by the first through-hole 110. The first connection member 252 is connected to the doped region 211 by the second through-hole 120. As shown in FIG. 1, the first through-hole 110 includes a left portion and a right portion, the source 281 is connected to the first connection member 252 by the left portion of the first through-hole 110, and the drain 282 is connected to the first connection member 252 by the right portion of the first through-hole 110. The second through-hole 120 also includes a left portion and a right portion, and the first connection member 252 is connected to the doped region 211 of the active layer 201 by the left portion and the right portion of the second through-hole 120.

The first through-hole 110 is formed between the source/drain layer 501 and the second metal layer 401, which is formed in the interlayer insulating layer 206 and the flexible material layer 207. The second through-hole 120 is formed between the second metal layer 401 and the active layer 201, which is formed in the second gate insulating layer 204 and the first gate insulating layer 202. In the array substrate of the present application, a thickness of the first gate insulating layer 202 is 130 nanometers, a thickness of the second gate insulating layer 204 is 110 nanometers, a thickness of the interlayer insulating layer 206 is 500 nanometers, and a thickness of the flexible material layer 207 is 1500 nanometers. Accordingly, a depth of the first through-hole 110 is greater than a depth of the second through-hole 120, and a wire breakage easily occurs when the first through-hole 110 is filled. The aperture of the first through-hole 110 is increased to increase a connection yield of the first through-hole 110.

In the prior art, in order to increase the flexibility of the array substrate, the flexible material layer 207 is formed on the side of the interlayer insulating layer 206 away from the second metal layer first, and then the source/drain layer is formed. The source 281 and the drain 282 are separately connected to the doped region 211 of the active layer 201 by a one-stage connection of a through-hole.

The source/drain layer is generally formed by a sputtering method. Because of a presence of the flexible material layer 207, a thickness between the source/drain layer and the active layer 201 is greater. When the source/drain layer is directly connected to the active layer 201 through the one-stage connection of the through-hole, a depth of the through-hole is greater. During the sputtering process, a source/drain layer material is difficult to fill in a portion of the through-hole near the active layer 201, which eventually causes the wire breakage. Therefore, the source 281 and the drain 282 are poorly connected to the active layer 201, which causes display screen abnormalities.

Figure 2:
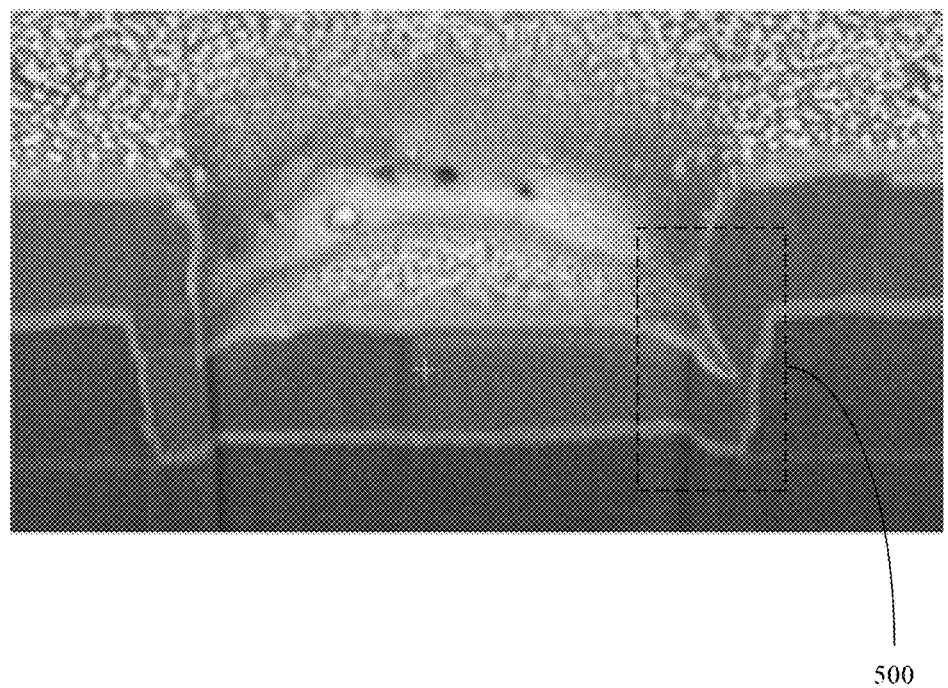
FIG. 2 is an electron microscopic slice image of a situation that a source/drain is disconnected in an array substrate in the prior art.

A specific wire breakage is shown in FIG. 2. The source/drain layer material in a first region 500 is not connected to the active layer, and no signal is output from a gate on array (GOA), resulting in an uncontrollable flexible organic light-emitting diode (OLED) screen.

Figure 3:
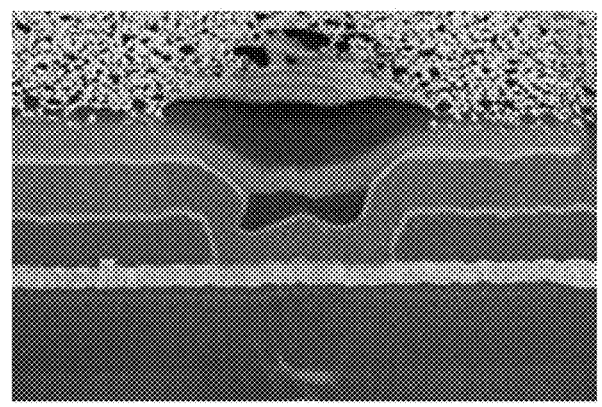
FIG. 3 is an electron microscopic slice image of a comparison of situations that source/drain layer are connected to film layers in array substrates in the prior art.
Figure 3:
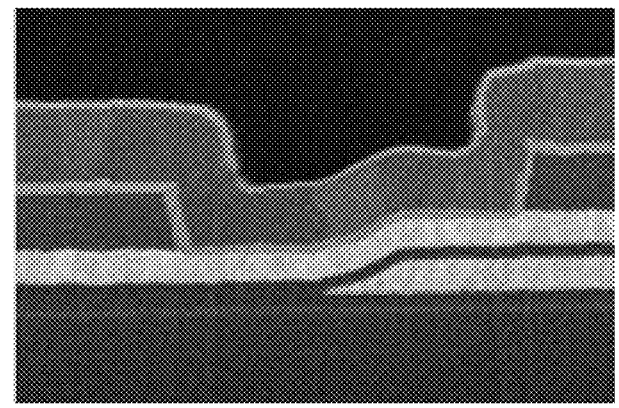
Figure 3:
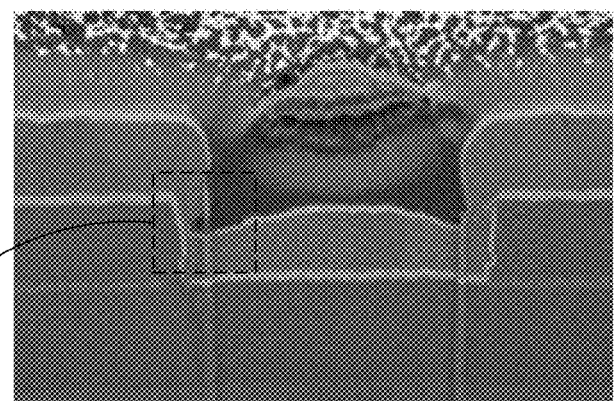

FIG. 3 compares connection situations between the source/drain layer and film layers. FIG. 3a shows a situation that the source/drain layer is connected to the first metal layer. FIG. 3b shows a situation that the source/drain layer is connected to the second metal layer. FIG. 3c shows a situation that the source/drain layer is connected to the active layer. It can be seen from FIG. 3 that when the source/drain layer is connected to the first metal layer by the through-hole, and the source/drain layer is connected to the second metal layer by the through-hole, no wire breakage occurs. When the source/drain layer is connected to the active layer, the wire breakage occurs in a second region 600 in FIG. 3. A higher difference makes the source/drain layer material difficult to enter the through-hole, resulting in poor connection between the source, the drain, and the active layer, which causes the display screen abnormalities.

In fact, regardless of the presence or absence of the flexible material layer 207, the source/drain layer is easily disconnected. After the flexible material layer 207 is disposed, the difference is greater, which makes the source/drain layer thinner and exposes the wire breakage. Therefore, a connection method needs to be improved to relieve the wire breakage.

By disposing the first through-hole 110 and the second through-hole 120 in the present application, when the source 281 and the drain 282 are connected to the active layer 201, the second metal layer is used as a transition layer, and an original method of the one-stage connection of the through-hole is converted to a two-stage connection of the through-hole. After this conversion, depths of the first through-hole 110 and the second through-hole 120 are less than that in the prior art. When the source/drain layer is sputtered, the source/drain layer material can easily enter the first through-hole 110 and the second through-hole 120. In addition, the aperture of the first through-hole 110 is greater than the aperture of second through-hole 120, which means that an aperture of the through-hole is greater in a film layer with greater depth, and the source/drain layer material can easily enter it. Through the two-stage connection of the through-hole and a corresponding configuration of the aperture of the through-hole, a connection yield of the source 281 and the drain 282 connected to the active layer 201 is increased.

Figure 4:
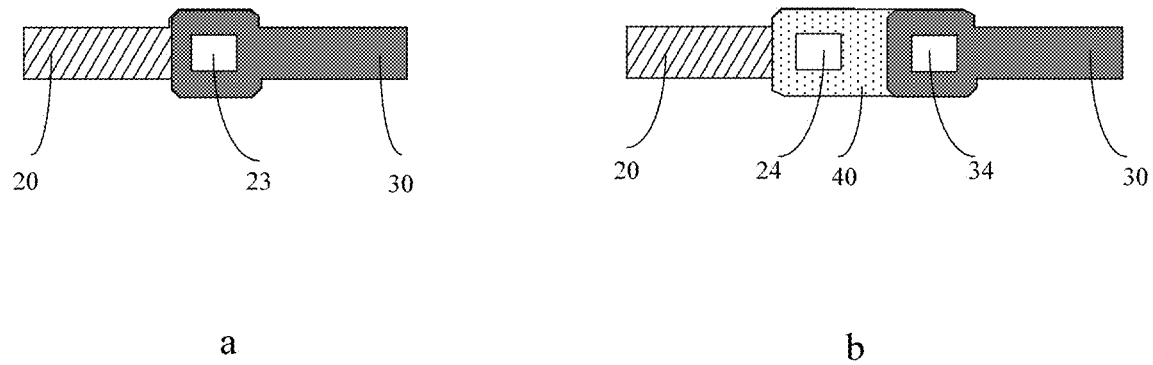
FIG. 4 is a plane view of a connection principle of each film layer in the array substrate provided by an embodiment of the present application.

A principle of the conversion is shown as FIG. 4. FIG. 4a is a plane view of a connection between the source/drain layer 30 and the active layer 20 in the prior art, and the source/drain layer 30 is directly connected to the active layer 20 by the through-hole 23. FIG. 4b is a plane view of a connection between the source/drain layer 30 and the active layer 20 in the present application. The present application additionally disposes the first connection member 40, the source/drain layer 30 is connected to the first connection member 40 by the first through-hole 34 first, and then the first connection member 40 is connected to the active layer 20 by the second through-hole 24. The prior art directly indirectly connects the source/drain layer 30 and the active layer 20, but the present application connects the source/drain layer 30 and the active layer 20 by the first connection member 40.

Figure 5:
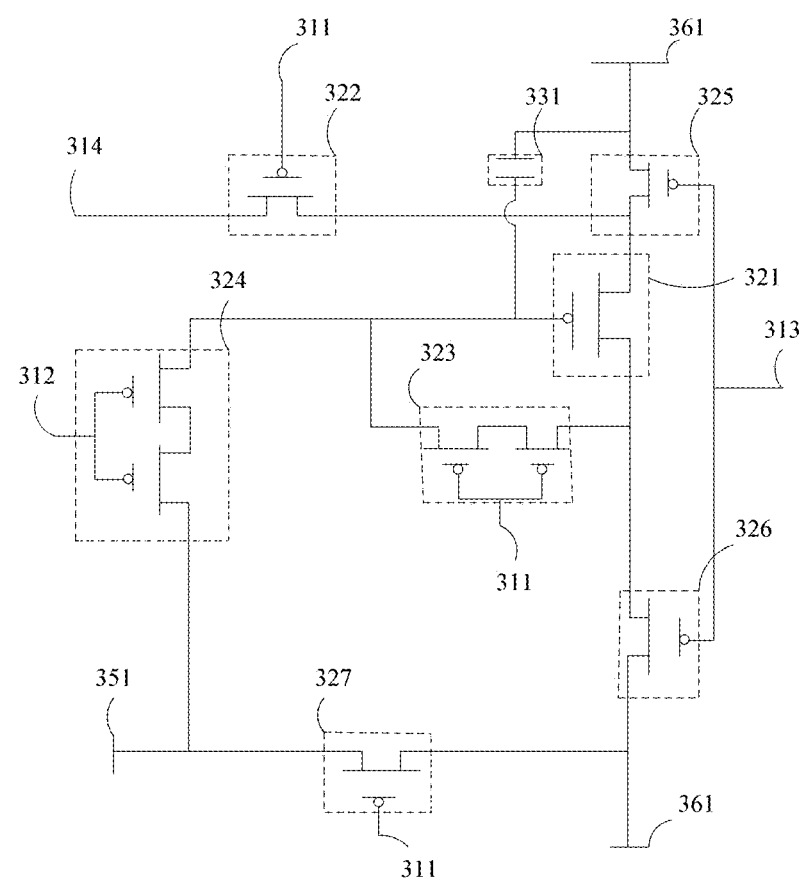
FIG. 5 is a 7T1C (seven transistors and one capacitor) circuit diagram of the array substrate provided by an embodiment of the present application.

The array substrate includes a plurality of pixels. Each of the plurality of the pixels includes three sub-pixels and is controlled by a 7T1C (seven transistors and one capacitor) circuit to emit light. The present application is described in detail below with reference to the 7T1C circuit. FIG. 5 is the 7T1C circuit including a first transistor 321, a second transistor 322, a third transistor 323, a fourth transistor 324, a fifth transistor 325, a sixth transistor 326, a seventh transistor 327, and a storage capacitor 331. The first transistor 321 is a driving transistor, and the second transistor 322 is a switching transistor.

A first scan signal line 311 is used to control on and off of the second transistor 322, the third transistor 323, and the seventh transistor 327. A second scan signal line 312 is used to control on and off of the fourth transistor 324. A data signal of a data signal line 314 is input when the second transistor 322 is turned on. In order to charge the storage capacitor 331, a reset signal end 351 is used to send a reset signal to reset an anode voltage of the plurality of the pixels and a voltage of the storage capacitor 331. A power line 361 is used to provide a data signal to make the plurality of pixels emit light.

In this embodiment, the fifth transistor 325 is used to provide the data signal of the power line 361 to a first electrode of the first transistor 321 under a control of a light-emitting control line 313. The sixth transistor 326 is used to conduct a second electrode of the first transistor 321 and an anode of the plurality of the pixels under the control of the light-emitting control line 313. The second transistor 322 is used to store the data signal of the data signal line 314 to the storage capacitor 331 under a control of the first scan signal line 311. The third transistor 323 is used to store a threshold signal of the first transistor 321 to the storage capacitor 331 under the control of the first scan signal line 311. The fourth transistor 324 is used to provide the reset signal of the reset signal end 351 to the storage capacitor 331 under a control of the second scan signal line 312 to reset the storage capacitor 331. The seventh transistor 327 is used to provide the reset signal of the reset signal end 351 to the anode of the plurality of the pixels under the control of the first scan signal line 311 to reset the anode voltage of the plurality of the pixels.

In an embodiment, a gate of the fifth transistor 325 is connected to the light-emitting control line 313. A first electrode of the fifth transistor 325 is connected to the power line 361 of the storage capacitor 331. A second electrode of the fifth transistor 325 is connected to the first electrode of the first transistor 321. A gate of the first transistor 321 is connected to the storage capacitor 331. The second electrode of the first transistor 321 is connected to a first electrode of the sixth transistor 326. A gate of the sixth transistor 326 is connected to the light-emitting control line 313. A second electrode of the sixth transistor 326 is connected to the anode of the plurality of the pixels.

In an embodiment, gates of the second transistor 322, the third transistor 323, and the seventh transistor 327 are connected to the first scan signal line 311. A first electrode of the second transistor 322 is connected to the data signal line 314. A second electrode of the second transistor 322 is connected to the first electrode of the first transistor 321. A first electrode of the third transistor 323 is connected to the second electrode of the first transistor 321. A second electrode of the third transistor 323 is connected to the storage capacitor 331. A first electrode of the seventh transistor 327 is connected to the reset signal end 351. A second electrode of the seventh transistor 327 is connected to the anode of the plurality of the pixels.

In an embodiment, a gate of the fourth transistor 324 is connected to the second scan signal line 312. A first electrode of the fourth transistor 324 is connected to the reset signal end 351. A second electrode of the fourth transistor 324 is connected to the storage capacitor 331.

In an embodiment, the first electrode is the source, and the second electrode is the drain. Or the first electrode is the drain, and the second electrode is the source. The switching transistor and the driving transistor are p-type transistors, or the switching transistor and the driving transistor are n-type transistors. Or the switching transistor is a p-type transistor, and the driving transistor is a n-type transistor. Or the switching transistor is a n-type transistor, and the driving transistor is a p-type transistor.

Figure 6:
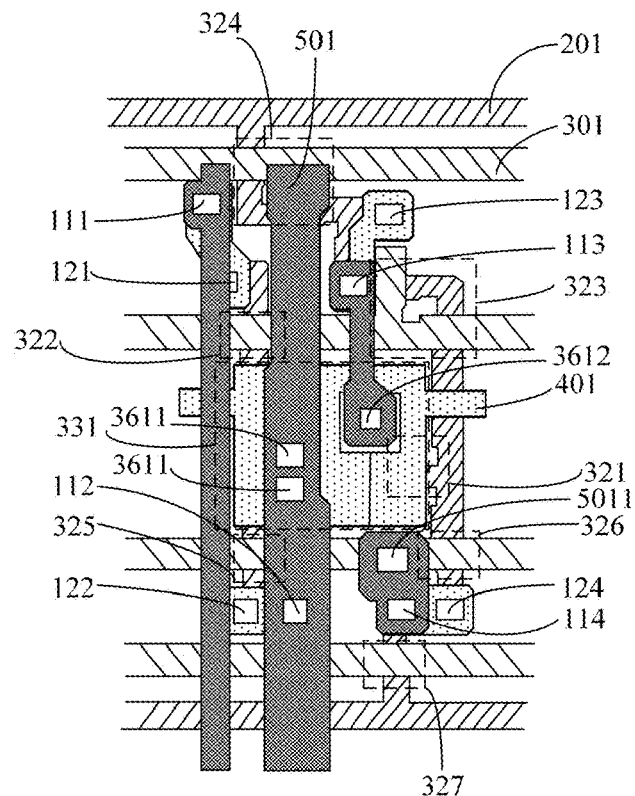
FIG. 6 is a plane view of a laminated structure of each film layer in the array substrate provided by an embodiment of the present application.
Figure 7:
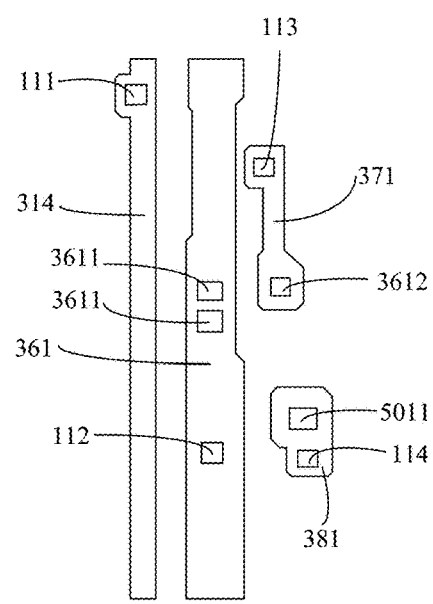
FIG. 7 is a plane view structural diagram of the source/drain layer and a first through-hole of the array substrate provided by an embodiment of the present application.
Figure 8:
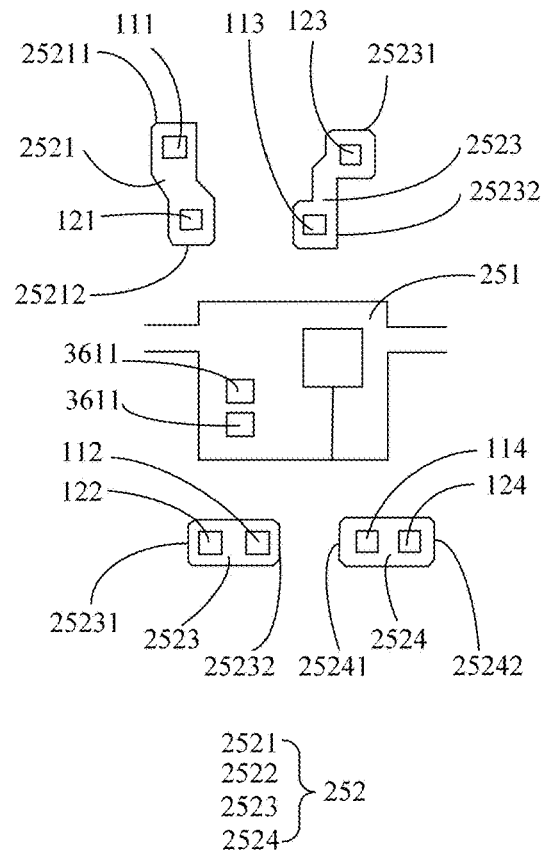
FIG. 8 is a plane view structural diagram of a second metal layer, the first through-hole, and a second through-hole of the array substrate provided by an embodiment of the present application.
Figure 9:
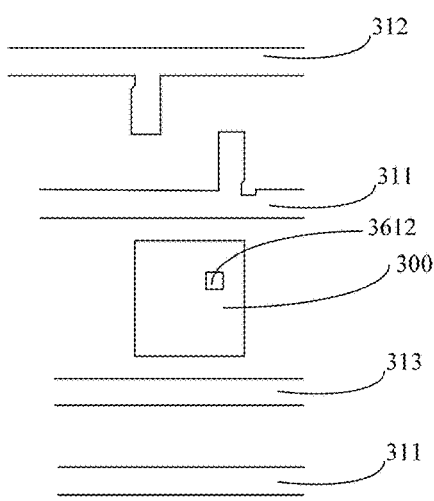
FIG. 9 is a plane view structural diagram of a first metal layer of the array substrate provided by an embodiment of the present application.
Figure 10:
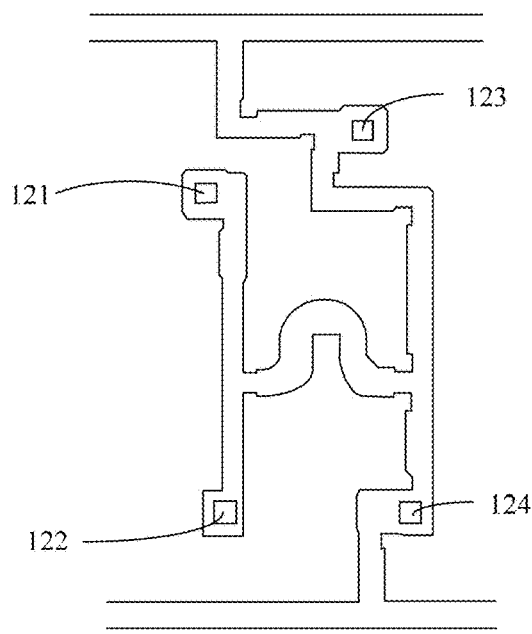
FIG. 10 a plane view structural diagram of an active layer and the second through-hole of the array substrate provided by an embodiment of the present application.

FIG. 6 is a plane view of a laminated structure of each film layer in the array substrate provided by an embodiment of the present application and includes the active layer 201, the first metal layer 301, the second metal layer 401, and source/drain layer 501 which are disposed in a stack. FIGS. 7 to 10 are plane view structural diagrams of the film layers and through-holes in the array substrate. Based on the circuit in FIG. 5, a connection method of the source/drain layer 501 and the active layer 201 is specifically described in detail below with reference to FIGS. 6 to 10.

The source/drain layer 501 is patterned to form the data signal line 314, the power line 361, a first connection line 371, and a second connection line 381.

The second metal layer 401 is patterned to form a second electrode plate 251 and the first connection member 252 of the storage capacitor 331. The first connection member 252 includes a first sub-connection member 2521, a second sub-connection member 2522, a third sub-connection member 2523, and a fourth sub-connection member 2524.

The first metal layer 301 is patterned to form the first scan signal line 311, the second scan signal line 312, the light-emitting control line 313, and a first electrode plate 300 of the storage capacitor 331.

The source/drain layer 501 is connected to the first connection member 252 in the second metal layer 401 by the first through-hole 110. The first connection member 252 is connected to the doped region of the active layer 201. The first through-hole 110 includes a first sub-through-hole 111, a second sub-through-hole 112, a third sub-through-hole 113, and a fourth sub-through-hole 114. The second through-hole 120 includes a fifth sub-through-hole 121, a sixth sub-through-hole 122, a seventh sub-through-hole 123, and an eighth sub-through-hole 124.

In FIG. 6, the array substrate includes the first transistor 321, the second transistor 322, the third transistor 323, the fourth transistor 324, the fifth transistor 325, the sixth transistor 326, the seventh transistor 327, and the storage capacitor 331. Projections of the active layer 201 and the first metal layer 301 on a substrate (not shown) have a plurality of overlapping regions. Portions of the first metal layer 301 located in each of the plurality of overlapping regions form the gates of each transistor. Portions of the active layer 201 located in each of the plurality of overlapping regions are not ion-doped and form the channel region. Portions located outside each of the plurality of overlapping regions are ion-doped to form the doped region.

The source/drain layer 501 is connected to the doped region of the active layer 201 of at least one of the second transistor 322, the third transistor 323, the fifth transistor 325, or the sixth transistor 326 by the first connection member 252.

The first scan signal line 311 is used to control the on and off of the second transistor 322, the third transistor 323, and the seventh transistor 327. The second scan signal line 312 is used to control the on and off of the fourth transistor 324.

In this embodiment, the data signal line 314 is connected to the first electrode of the second transistor 322 and inputs the data signal. The first electrode of the second transistor 322 is connected to a first connection end 25211 of the first connection member 2521 by the first sub-through-hole 111. A second connection end 25212 of the first connection member 2521 is connected to the doped region of the active layer 201 of the second transistor 322 by the fifth sub-through-hole 121.

The second electrode of the second transistor 322 is connected to the second electrode of the fifth transistor 325 and the first electrode of the first transistor 321. In this embodiment, because the doped regions of the active layer 201 of the second transistor 322, the fifth transistor 325, and the first transistor 321 are connected together, the second electrode of the second transistor 322 can output the data signal to the second electrode of the fifth transistor 325 and the first electrode of the first transistor 321 along the doped region of the active layer 201.

The power line 361 is connected to the first electrode of the fifth transistor 325 and inputs a power signal. The first electrode of the fifth transistor 325 is connected to a third connection end 25221 of the second sub-connection member 2522 by the second sub-through-hole 112. A fourth connection end 25222 of the second sub-connection member 2522 is connected to the doped region of the active layer 201 of the fifth transistor 325 by the sixth sub-through-hole 122.

The power line 361 is further connected to the second electrode plate 251 of the storage capacitor 331 by a first capacitor through-hole 3611.

The second electrode of the first transistor 321 is connected to the first electrode of the third transistor 323 and the first electrode of the sixth transistor 326. In this embodiment, because the doped regions of the active layer 201 of the first transistor 321, the third transistor 323, and the sixth transistor 326 are connected together, the second electrode of the first transistor 321 can output the data signal to the first electrode of the third transistor 323 and the first electrode of the sixth transistor 326 along the doped region of the active layer 201.

A portion of the first electrode plate 300 of the storage capacitor 331 is further used as the gate of the first transistor 321. The first electrode plate 300 of the storage capacitor 331 is connected to the second electrode of the fourth transistor 324 and the second electrode of the third transistor 323. In this embodiment, the first electrode plate 300 of the storage capacitor 331 is connected to one end of the first connection line 371 in the source/drain layer 501 by a second capacitor through-hole 3612. Another end of the first connection line 371 is connected to a fifth connection end 25231 of the third sub-connection member 2523 by a third sub-through-hole 113. A sixth connection end 25232 of the third sub-connection member 2523 is connected to the doped region of the active layer 201 of the third transistor 323 by a seventh sub-through-hole 123. A connection between the first electrode plate 300 of the storage capacitor 331, the second electrode of the fourth transistor 324, and the second electrode of the third transistor 323 is realized finally.

The reset signal end (not shown) is connected to the first electrode of the fourth transistor 324 and the first electrode of the seventh transistor 327 and inputs the reset signal.

The second electrode of the sixth transistor 326 is connected to the second electrode of the seventh transistor 327. In this embodiment, because the doped regions of the active layer 201 of the sixth transistor 326 and the seventh transistor 327 are connected together, the second electrode of the seventh transistor 327 can output the reset signal to the second electrode of the sixth transistor 326 along the doped region of the active layer 201.

At the second electrode of the sixth transistor 326, an eighth connection end 25242 of the fourth sub-connection member 2524 is connected to the doped region of the active layer 201 of the sixth transistor 326 by the eighth sub-through-hole 124. A seventh connection end 25241 of the fourth sub-connection member 2524 is connected to one end of the second connection line 381 in the source/drain layer 501 by the fourth sub-through-hole 114. Another end of the second connection line 381 is connected to an anode (not shown) of the plurality of pixels by a source/drain through-hole 5011.

The third connection end 25221, the fifth connection end 25231, and the seventh connection end 25241 correspond to the first connection end 25211, which means that they all are used to connect the first through-hole 110. The fourth connection end 25222, the sixth connection end 25232, and eighth connection end 25242 correspond to the second connection end 25212, which means that they all are used to connect the second through-hole 120.

A shape of the first connection member 252 may be various. The following takes the first sub-connection member 2521 as an example. The second sub-connection member 2522, the third sub-connection member 2523, and the fourth sub-connection member 2524 are similar to the first sub-connection member 2521.

In an embodiment, a projection of the first connection end 25211 on the substrate does not coincide with a projection of the second connection end 25212 on the substrate, which means that there is a certain distance between the first connection end 25211 and the second connection end 25212 of the first sub-connection member 2521. The first sub-connection member 2521 is equivalent to a straight line or a curved line. A projection of the first sub-through-hole 111 on the substrate does not completely coincide with a projection of the fifth sub-through-hole 121 on the substrate.

In an embodiment, the projection of the first connection end 25211 on the substrate coincides with the projection of the second connection end 25212 on the substrate, which means that the first connection end 25211 and the second connection end 25212 of the first sub-connection member 2521 are actually a same end. The first sub-connection member 2521 is equivalent to a point. The projection of the first sub-through-hole 111 on the substrate coincides with the projection of the fifth sub-through-hole 121 on the substrate.

In an embodiment, the first connection member 252 is parallel to the second electrode plate 251. The first connection member 252 and the second electrode plate 251 are formed by patterning the second metal layer 401. The second electrode plate 251 is generally a rectangular structure. The first connection member 252 is parallel to the second electrode plate 251. Accordingly, the first connection member 252 is a linear structure, which has a simple manufacturing process and is easier to align the first through-hole 110 and the second through-hole 120. A situation that the first connection member 252 is parallel to the second electrode plate 251 is shown in the fifth transistor 325 and the sixth transistor 326 in FIG. 8.

In an embodiment, the first connection member 252 is not parallel to the second electrode plate 251. As shown in the second transistor 322 and the third transistor 323 in FIG. 6, an arrangement of the first through-hole 110 and the second through-hole 120 is limited by metal wires in the source/drain layer 501 and the active layer 201. At this time, the first connection member 252 is not parallel to the second electrode plate 251. The first connection member 252 can be a straight line directly connecting the first through-hole 110 and the second through-hole 120 or can be a curved line. Because the second metal layer 401 is only used as the storage capacitor in the prior art, there is a large space for designing the first connection member 252. In this way, a shape and a position of the first connection member 252 can be designed according to requirements.

In an embodiment, a distance between the first connection member 252 and the second electrode plate 251 is greater than or equal to a quarter of a width of a sub-pixel in the array substrate. Because of the storage capacitor formed between the first metal layer 301 and the second metal layer 401, a proper distance must be maintained between the first connection member 252 and the second electrode plate 251 to prevent the first connection member 252 and the first electrode plate 300 from interacting and affecting a performance of the array substrate.

In an embodiment, a length of the first connection member 252 is less than a length of the second electrode plate 251. Because the first connection member 252 is only used as a transition between the first through-hole 110 and the second through-hole 120, the length of the first connection member 252 does not need to be too long, in a bid to prevent interaction with the metal wires of other layers which affects the performance of the array substrate.

Figure 11:
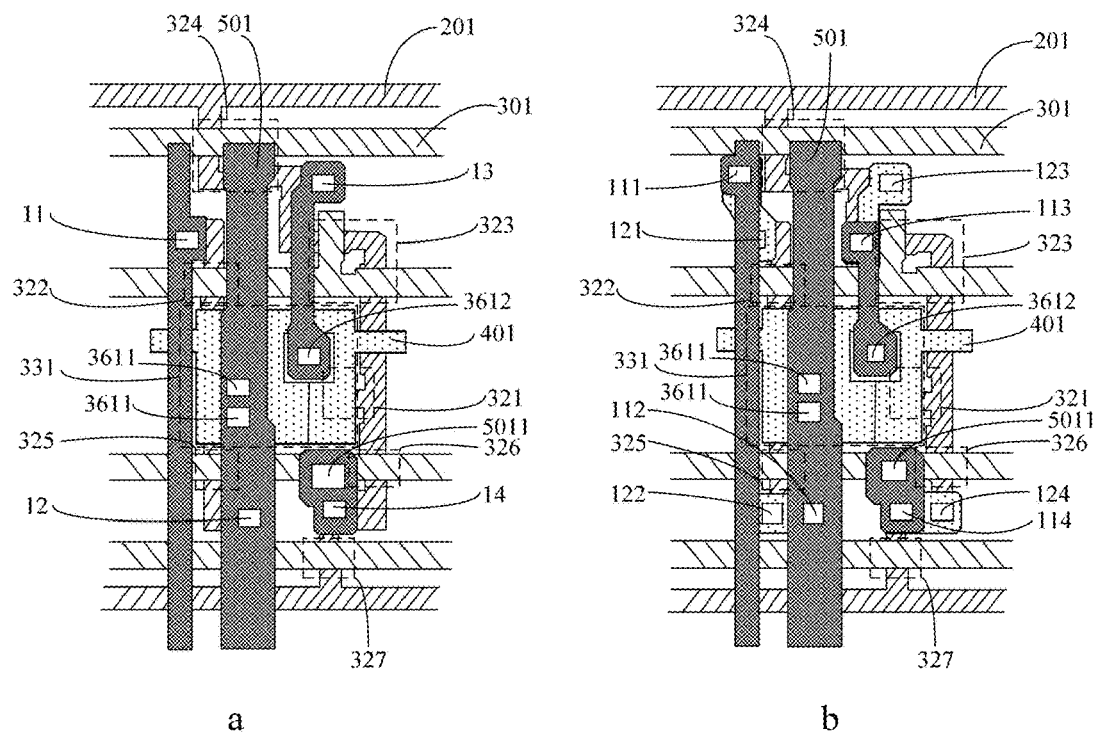
FIG. 11 is a plane view structural diagram of a comparison of laminated structures of the film layers in the prior art and the present application.
Figure 12:
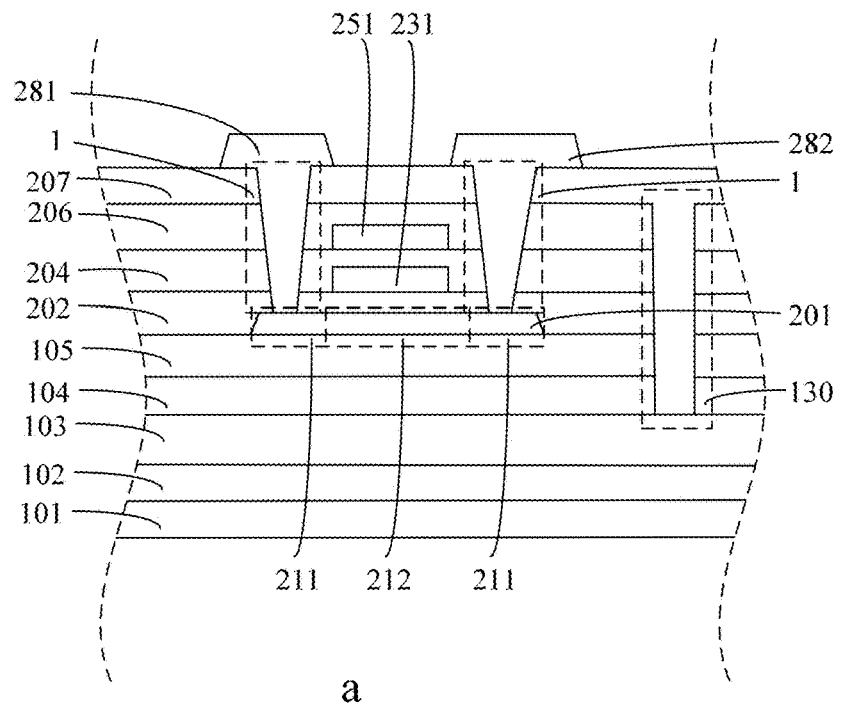
FIG. 12 is a structural diagram of a comparison of the film layers in the prior art and the present application.
Figure 12:
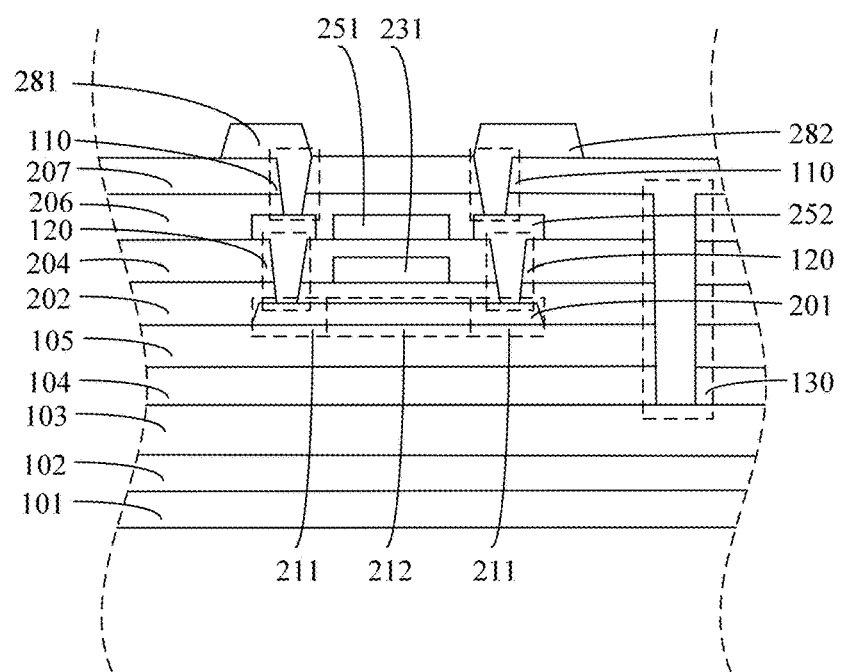

FIG. 11 is a plane view structural diagram of a comparison of laminated structures of the film layers in the prior art and the present application, FIG. 12 is a structural diagram of a comparison of the film layers in the prior art and the present application, and the prior art and the present application are compared and described below with reference to FIGS. 11 and 12.

As shown in FIG. 11a, which is the plane view structural diagram of the laminated structure of the film layers in the prior art and includes the active layer 201, the first metal layer 301, the second metal layer 401, and source/drain layer 501 which are disposed in a stack.

The first electrode of the second transistor 322 is connected to the doped region of the active layer 201 by a fourth through-hole 11. The first electrode of the fifth transistor 325 is connected to the doped region of the active layer 201 by a fifth through-hole 12. The first electrode plate 300 of the storage capacitor 331 is connected to the first connection line 371 by the second capacitor through-hole 3612. The first connection line 371 is connected to the doped region of the active layer 201 of the third transistor 323 by a sixth through-hole 13. At the second electrode of the sixth transistor 326, the doped region of the active layer 201 is connected to the second connection line 381 by a seventh through-hole 14. The source/drain layers 501 of each transistor are connected to the doped region of the active layer 201 only through the one-stage connection of the through-hole.

As shown in FIG. 11b, which is the plane view structural diagram of the laminated structure of the film layers of the 7T1C circuit in the present application, the second transistor 324, the fifth transistor 325, the third transistor 323, and the sixth transistor 326 are connected through the two-stage connection of the through-hole to realize a connection between the source/drain layer 501 and the doped region of the active layer 201.

As shown in FIG. 12*a*, which is the structural diagram of the film layers in the prior art, the source 281 and the drain 282 are connected to the doped region 211 of the active layer 201 only through the one-stage connection of the through-hole. As shown in FIG. 12*b*, which is the structural diagram of the film layers in the present application, the source 281 and the drain 282 are connected to the first connection member 252 by first through-hole 110, and then the first connection member 252 is connected to the doped region 211 of the active layer 201 by the second through-hole 252.

In the above comparisons, when the source/drain layers 501 is directly connected to the active layer 201 through the one-stage connection of the through-hole, a depth of the through-hole is greater. During the sputtering process, the source/drain layer material is difficult to fill in the portion of the through-hole near the active layer 201, which eventually causes the wire breakage. Therefore, the source 281 and the drain 282 are poorly connected to the active layer 201, which causes display screen abnormalities.

In embodiments of the present application, the source/drain layer 501 of transistors and the doped region of the active layer 201 are connected through the two-stage connection of the through-hole. It can be seen from FIGS. 6 to 10 that using the second metal layer 401 as a transition layer can realize a conversion between the source/drain layer 501 and the active layer 201 without increasing occupied space. Therefore, this solution has very high practical application value for solving the problem of the wire breakage of connections of the source and the drain of flexible OLED products.

As shown in FIG. 1, the array substrate is further formed with a third through-hole 130. The flexible material layer 207 is connected to the substrate by the third through-hole 130. A distance between at least one of the first through-hole 110 or the second through-hole 120 and the third through-hole is greater than a preset value.

The flexible material layer 207 is configured to increase the flexibility of the array substrate. Disposing the third through-hole 130 in the array substrate to connect to the substrate can further increase the flexibility of the array substrate.

The material of the flexible material layer 207 is the organic flexible material. When forming the flexible material layer 207 and filling the third through-hole 130, because of excellent fluidity of the organic flexible material, the organic flexible material tends to fill the first through-hole 110, and the third through-hole will be filled. The closer the third through-hole 130 and first through-hole 110 are, the stronger a tendency of the organic flexible material to fill the first through-hole 110. A filling of the first through-hole 110 by the organic flexible material adversely affects the subsequent formation of the source/drain layer, and may further cause a fault of the source/drain layer. Therefore, a distance between the first through-hole 110 and the third through-hole 130 should be as far as possible to reduce a risk of causing faults of the source/drain layer.

Figure 13:
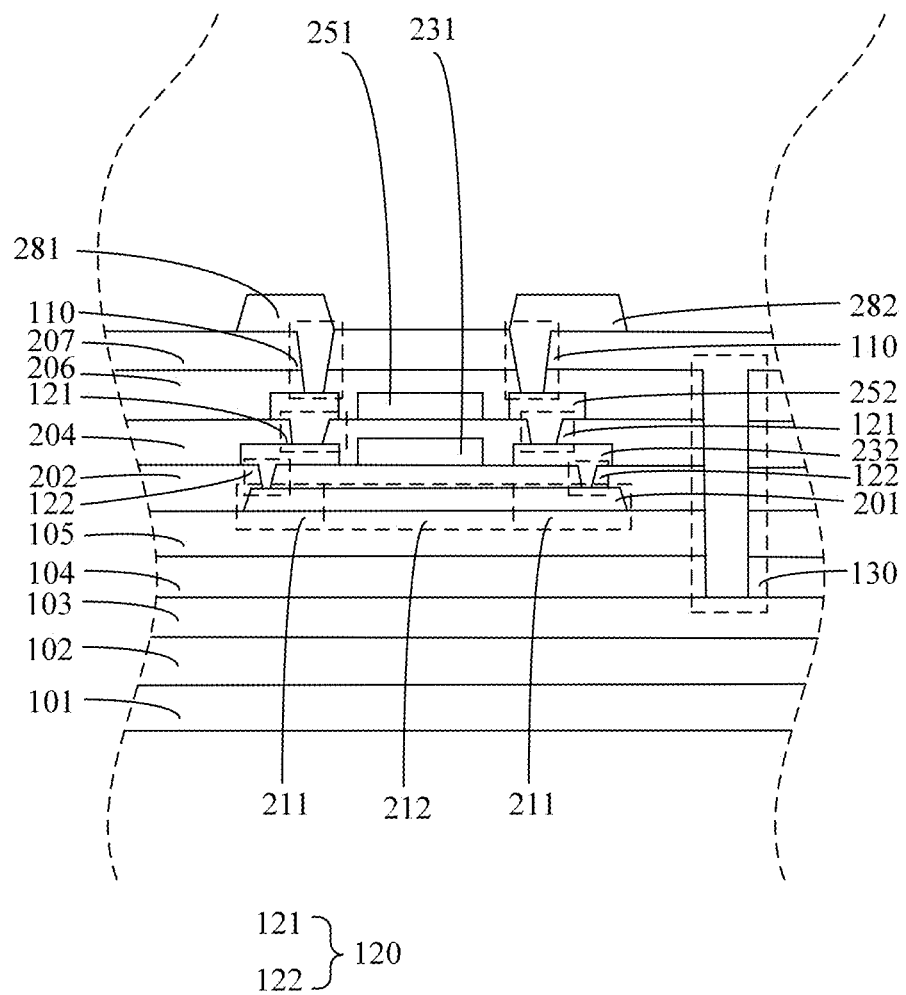
FIG. 13 is a second structural diagram of the array substrate provided by an embodiment of the present application.

Shown in FIG. 13 is a second structural diagram of the array substrate provided by an embodiment of the present application. In this embodiment, the second through-hole 120 includes a first branch-through-hole 121 and a second branch-through-hole 122. The first metal layer is patterned to formed a second connection member 232. The first connection member 252 is connected to the second connection member 232 by the first branch-through-hole 121, and the second connection member 232 is connected to the doped region 211 by the second branch-through-hole 122.

The first metal layer is patterned to form the gate 231 and the second connection member 232. The first through-hole 110, the first branch-through-hole 121, and the second branch-through-hole 122 include left portions and right portions. The source 281 is connected to the first connection member 252 in the second metal layer by the left portion of the first through-hole 110, and the drain 282 is connected to the first connection member 252 in the second metal layer by the right portion of the first through-hole 110. The first connection member 252 is connected to the second connection member 232 in the first metal layer by the left portion and the right portion of the first branch-through-hole 121. The second connection member 232 is connected to the doped region 211 of the active layer 201 by the left portion and the right portion of the second branch-through-hole 122.

By disposing the first through-hole 110, the first sub-through-hole 121, and the second sub-through-hole 122, when the source 281 and the drain 282 are connected to the active layer 201, the second metal layer and the first metal layer are used as transition layers, and the original method of the one-stage connection of the through-hole is converted to a three-stage connection of the through-hole. After this conversion, depths of the first through-hole 110, the first sub-through-hole 121, and the second sub-through-hole 122 are less than that in the prior art. When the source/drain layer is sputtered, the source/drain layer material can easily enter the first through-hole 110, the first sub-through-hole 121, and the second sub-through-hole 122, so that the connection yield of the source 281 and the drain 282 connected to the active layer 201 is increased.

The present application further provided a display panel including the array substrate. The array substrate includes the substrate, the active layer, the first metal layer, the second metal layer, the flexible material layer, and the source/drain layer. The active layer is formed on the side of the substrate and is patterned to form the channel region and the doped region. The first metal layer is formed on the side of the active layer away from the substrate and is patterned to form the gate. The second metal layer is formed on the side of the first metal layer away from the active layer and is patterned to form the first connection member. The flexible material layer is formed on the side of the second metal layer away from the first metal layer. The source/drain layer is formed on the side of the flexible material layer away from the second metal layer and is patterned to form the source and the drain. The source or the drain is connected to the first connection member by the first through-hole. The first connection member is connected to the doped region by the second through-hole. The aperture of the first through-hole is greater than the aperture of the second through-hole.

In an embodiment, the first connection member includes the first connection end and the second connection end. The first connection end is connected to the first through-hole. The second connection end is connected to the second through-hole. The projection of the first connection end on the substrate coincides with the projection of the second connection end on the substrate.

In an embodiment, the first connection member includes the first connection end and the second connection end. The first connection end is connected to the first through-hole. The second connection end is connected to the second through-hole. The projection of the first connection end on the substrate does not coincide with the projection of the second connection end on the substrate.

In an embodiment, the first connection member is parallel to the second electrode plate.

In an embodiment, the distance between the first connection member and the second electrode plate is greater than or equal to a quarter of the width of the sub-pixel in the array substrate.

In an embodiment, the length of the first connection member is less than the length of the second electrode plate.

In an embodiment, the array substrate includes the third through-hole. The flexible material layer is connected to the substrate by the third through-hole. The distance between the first through-hole and the third through-hole is greater than the preset value.

In an embodiment, the second through-hole includes the first branch-through-hole and the second branch-through-hole. The first metal layer is patterned to formed the second connection member. The first connection member is connected to the second connection member by the first branch-through-hole. The second connection member is connected to the doped region by the second branch-through-hole.

In an embodiment, the array substrate includes the plurality of pixels. The sub-pixel of the plurality of pixels includes the first transistor, the second transistor, the third transistor, the fourth transistor, the fifth transistor, the sixth transistor, the seventh transistor, and the storage capacitor. The source/drain layer is patterned to form the data signal line and the power line. The first metal layer is patterned to form the first scan signal line and the first electrode plate of the storage capacitor. The second metal layer is patterned to form the first connection member and the second electrode plate of the storage capacitor. The first connection member includes the first sub-connection member, the second sub-connection member, the third sub-connection member, and the fourth sub-connection member. The first transistor is the driving transistor. The second transistor is the switching transistor. The source/drain layer is connected to the doped region of the active layer of at least one of the second transistor, the third transistor, the fifth transistor, or the sixth transistor by the first connection member.

In an embodiment, the gate of the second transistor is connected to the first scan signal line. The first electrode of the second transistor is connected to the data signal line. The first electrode of the second transistor is connected to the first sub-connection member by the first sub-through-hole. The first sub-connection member is connected to the doped region of the active layer of the second transistor by the fifth sub-through-hole.

In an embodiment, the first electrode of the fifth transistor is connected to the power line. The first electrode of the fifth transistor is connected to the second sub-connection member by the second sub-through-hole. The second sub-connection member is connected to the doped region of the active layer of the fifth transistor by the sixth sub-through-hole.

In an embodiment, the source/drain layer is further patterned to form the first connection line. One end of the first connection line is connected to the first electrode plate of the storage capacitor. Another end of the first connection line is connected to the third sub-connection member by the third sub-through-hole. The third sub-connection member is connected to the doped region of the active layer of the third transistor by the seventh sub-through-hole.

In an embodiment, the source/drain layer is further patterned to form the second connection line. One end of the second connection line is connected to the anode of the plurality of pixels. Another end of the second connection line is connected to the fourth sub-connection member by the fourth sub-through-hole. The fourth sub-connection member is connected to the doped region of the active layer of the sixth transistor by the eighth sub-through-hole.

In summary, the present application provides the array substrate and the display panel. The array substrate includes the substrate, the active layer, the first metal layer, the second metal layer, the flexible material layer, and the source/drain layer. The active layer is formed on the side of the substrate and is patterned to form the channel region and the doped region. The first metal layer is formed on the side of the active layer away from the substrate and is patterned to form the gate. The second metal layer is formed on the side of the first metal layer away from the active layer and is patterned to form the first connection member. The flexible material layer is formed on the side of the second metal layer away from the first metal layer. The source/drain layer is formed on the side of the flexible material layer away from the second metal layer and is patterned to form the source and the drain. The source or the drain is connected to the first connection member by the first through-hole. The first connection member is connected to the doped region by the second through-hole. By disposing the first through-hole and the second through-hole, the source and the drain use the second metal layer as the transition and are connected to the active layer in two stages, and the depth of each through-hole is reduced compared to a one-stage connection of a through-hole. Therefore, it is easier for film layers disposed on both ends of the through-holes to realize connections, and the technical problem of the poor connection between the source and the drain and the active layer is relieved.

Understandably, those having ordinary skills of the art may easily contemplate various changes and modifications of the technical solution and technical ideas of the present application and all these changes and modifications are considered within the protection scope of right for the present application.

What is claimed is:

1. An array substrate, comprising:
a substrate;
an active layer formed on a side of the substrate and patterned to form a channel region and a doped region;
a first metal layer formed on a side of the active layer away from the substrate and patterned to form a gate;
a second metal layer formed on a side of the first metal layer away from the active layer and patterned to form a first connection member;
a flexible material layer formed on a side of the second metal layer away from the first metal layer; and
a source/drain layer formed on a side of the flexible material layer away from the second metal layer and patterned to form a source and a drain;
wherein the source or the drain is connected to the first connection member by a first through-hole, the first connection member is connected to the doped region by a second through-hole, and an aperture of the first through-hole is greater than an aperture of the second through-hole; wherein the array substrate comprises a plurality of pixels, a sub-pixel of the plurality of pixels comprises a first transistor, a second transistor, a third transistor, a fourth transistor, a fifth transistor, a sixth transistor, a seventh transistor, and a storage capacitor; the source/drain layer is further patterned to form a data signal line and a power line, the first metal layer is further patterned to form a first scan signal line and a first electrode plate of the storage capacitor, the second metal layer is patterned to form the first connection member and a second electrode plate of the storage capacitor; the first connection member comprises a first sub-connection member, a second sub-connection member, a third sub-connection member, and a fourth sub-connection member, the first transistor is a driving transistor, the second transistor is a switching transistor, and the source/drain layer is connected to the doped region of the active layer of at least one of the second transistor, the third transistor, the fifth transistor, or the sixth transistor by the first connection member.

2. The array substrate as claimed in claim 1, wherein the first connection member comprises a first connection end and a second connection end, the first connection end is connected to the first through-hole, the second connection end is connected to the second through-hole, and a projection of the first connection end on the substrate coincides with a projection of the second connection end on the substrate.

3. The array substrate as claimed in claim 1, wherein the first connection member comprises a first connection end and a second connection end, the first connection end is connected to the first through-hole, the second connection end is connected to the second through-hole, and a projection of the first connection end on the substrate does not coincide with a projection of the second connection end on the substrate.

4. The array substrate as claimed in claim 1, wherein the first connection member is parallel to the second electrode plate.

5. The array substrate as claimed in claim 1, wherein a distance between the first connection member and the second electrode plate is greater than or equal to a quarter of a width of a sub-pixel in the array substrate.

6. The array substrate as claimed in claim 1, wherein a length of the first connection member is less than a length of the second electrode plate.

7. The array substrate as claimed in claim 1, wherein the array substrate comprises a third through-hole, the flexible material layer is connected to the substrate by the third through-hole, and a distance between the first through-hole and the third through-hole is greater than a preset value.

8. The array substrate as claimed in claim 1, wherein the second through-hole comprises a first branch-through-hole and a second branch-through-hole, the first metal layer is further patterned to formed a second connection member, the first connection member is connected to the second connection member by the first branch-through-hole, and the second connection member is connected to the doped region by the second branch-through-hole.

9. The array substrate as claimed in claim 1, wherein a gate of the second transistor is connected to the first scan signal line, a first electrode of the second transistor is connected to the data signal line, the first electrode of the second transistor is connected to the first sub-connection member by a first sub-through-hole, and the first sub-connection member is connected to the doped region of the active layer of the second transistor by a fifth sub-through-hole.

10. The array substrate as claimed in claim 1, wherein a first electrode of the fifth transistor is connected to the power line, the first electrode of the fifth transistor is connected to the second sub-connection member by a second sub-through-hole, and the second sub-connection member is connected to the doped region of the active layer of the fifth transistor by a sixth sub-through-hole.

11. The array substrate as claimed in claim 1, wherein the source/drain layer is further patterned to form a first connection line, one end of the first connection line is connected to the first electrode plate of the storage capacitor, another end of the first connection line is connected to the third sub-connection member by a third sub-through-hole, and the third sub-connection member is connected to the doped region of the active layer of the third transistor by a seventh sub-through-hole.

12. The array substrate as claimed in claim 1, wherein the source/drain layer is further patterned to form a second connection line, one end of the second connection line is connected to an anode of the plurality of pixels, another end of the second connection line is connected to the fourth sub-connection member by a fourth sub-through-hole, and the fourth sub-connection member is connected to the doped region of the active layer of the sixth transistor by an eighth sub-through-hole.

13. A display panel, comprising an array substrate;
wherein the array substrate comprises:
a substrate;
an active layer formed on a side of the substrate and patterned to form a channel region and a doped region;
a first metal layer formed on a side of the active layer away from the substrate and patterned to form a gate;
a second metal layer formed on a side of the first metal layer away from the active layer and patterned to form a first connection member;
a flexible material layer formed on a side of the second metal layer away from the first metal layer; and
a source/drain layer formed on a side of the flexible material layer away from the second metal layer and patterned to form a source and a drain;
wherein the source or the drain is connected to the first connection member by a first through-hole, the first connection member is connected to the doped region by a second through-hole, and an aperture of the first through-hole is greater than an aperture of the second through-hole; wherein the array substrate comprises a plurality of pixels, a sub-pixel of the plurality of pixels comprises a first transistor, a second transistor, a third transistor, a fourth transistor, a fifth transistor, a sixth transistor, a seventh transistor, and a storage capacitor; the source/drain layer is further patterned to form a data signal line and a power line, the first metal layer is further patterned to form a first scan signal line and a first electrode plate of the storage capacitor, the second metal layer is patterned to form the first connection member and a second electrode plate of the storage capacitor; the first connection member comprises a first sub-connection member, a second sub-connection member, a third sub-connection member, and a fourth sub-connection member, the first transistor is a driving transistor, the second transistor is a switching transistor, and the source/drain layer is connected to the doped region of the active layer of at least one of the second transistor, the third transistor, the fifth transistor, or the sixth transistor by the first connection member.

14. The display panel as claimed in claim 13, wherein the first connection member comprises a first connection end and a second connection end, the first connection end is connected to the first through-hole, the second connection end is connected to the second through-hole, and a projection of the first connection end on the substrate coincides with a projection of the second connection end on the substrate.

15. The display panel as claimed in claim 13, wherein the first connection member comprises a first connection end and a second connection end, the first connection end is connected to the first through-hole, the second connection end is connected to the second through-hole, and a projection of the first connection end on the substrate does not coincide with a projection of the second connection end on the substrate.

16. The display panel as claimed in claim 13, wherein the first connection member is parallel to the second electrode plate.

17. The display panel as claimed in claim 13, wherein a distance between the first connection member and the second electrode plate is greater than or equal to a quarter of a width of a sub-pixel in the array substrate.

18. The display panel as claimed in claim 13, wherein a length of the first connection member is less than a length of the second electrode plate.

19. The display panel as claimed in claim 13, wherein the array substrate comprises a third through-hole, the flexible material layer is connected to the substrate by the third through-hole, and a distance between the first through-hole and the third through-hole is greater than a preset value.

* * * * *